United States Patent [19]

Morishita et al.

[11] Patent Number: 5,024,920
[45] Date of Patent: Jun. 18, 1991

[54] PROCESS FOR FORMING A PATTERN USING A PHOTOSENSITIVE AZIDE AND A HIGH-MOLECULAR WEIGHT COPOLYMER OR POLYMER

[75] Inventors: Hajime Morishita, Tokyo; Nobuaki Hayashi, Saitama; Saburo Nonogaki, Tokyo; Michiaki Hashimoto, Sayama; Masato Ito, Kokubunji; Masahiro Nishizawa; Kiyoshi Miura, both of Mobara; Yoshiyuki Odaka, Chiba, all of Japan

[73] Assignee: Hitachi, Ltd., Japan

[21] Appl. No.: 355,635

[22] Filed: May 23, 1989

[30] Foreign Application Priority Data

May 31, 1988 [JP] Japan .................................. 63-134177

[51] Int. Cl.$^5$ ........................ G03C 5/00; G03C 16/95; G03F 7/012
[52] U.S. Cl. .................................... 430/325; 430/195; 430/197
[58] Field of Search .................. 430/325, 197, 195, 28

[56] References Cited

U.S. PATENT DOCUMENTS

| 2,948,610 | 8/1960 | Merrill et al. | 430/195 |
| 3,917,794 | 1/1975 | Akagi et al. | 427/68 |
| 4,086,090 | 4/1978 | Kohashi et al. | 430/325 |
| 4,241,162 | 12/1980 | Hatano et al. | 430/195 |
| 4,332,874 | 6/1982 | Hayashi et al. | 430/325 |

Primary Examiner—Charles L. Bowers, Jr.
Assistant Examiner—John S. Y. Chu
Attorney, Agent, or Firm—Pennie & Edmonds

[57] ABSTRACT

This invention relates to a process for forming a pattern using a photosensitive composition comprising a polymeric azide and a high-molecular weight copolymer or polymer. The photosensitive composition comprises a copolymer containing at least a water-soluble non-photosensitive monomeric unit having an electrolytic functional group, a monomeric unit having an azido group and an electrolytic functional group and a high-soluble high molecular weight copolymer or polymer which exhibits reciprocity law failure characteristic.

1 Claim, 1 Drawing Sheet

PROCESS FOR FORMING A PATTERN USING A PHOTOSENSITIVE AZIDE AND A HIGH-MOLECULAR WEIGHT COPOLYMER OR POLYMER

BACKGROUND OF THE INVENTION

This invention relates to a water-soluble photosensitive composition, a process for forming a pattern using the same and a high-molecular compound. In particular, it relates to a water-soluble photosensitive composition suitable for manufacture of a color cathoderay tube, a process for forming a pattern by using the composition, and a high-molecular compound responding to radiation.

As one example of the conventional pattern forming processes, U.S. Pat. No. 3917794 describes a process for manufacturing a black matrix of a color cathode-ray tube and a photosensitive composition usable for the process. The described process is to form a pattern of areas, which are substantially smaller than irradiated areas, by using a photosensitive composition having a reciprocity law failure characteristic, e.g., a composition comprised of a high-molecular compound such as an acrylamide-diacetone acrylamide copolymer, etc., and a bisazido-type crosslinking reagent.

The above process will be explained in detail hereinbelow. The structure of the black matrix-type color cathode-ray tube is that a phosphor pattern of dots, stripes, or the like, of red, blue and green phosphors is present in the inner surface of a panel, and a nonluminous, light-absorbing material such as carbon, etc., is embedded in spaces which are existing interdot, interstripe, etc. The following explanation is limited to a process for producing a pattern of dots for the explanatory convenience. First, a coating of a photosensitive composition having the above reciprocity law failure characteristic is formed on the inner surface of a color cathode-ray tube faceplate, the phosphor dot-forming positions are exposed through a shadow mask, and the coating is developed to form dots of the photosensitive composition. Carbon is coated thereon, and the dots are removed by a remover liquid together with carbon coated thereon. Holes of black matrix are so formed. Phosphor dots of red, blue and green are formed in the holes successively. Due to the use of a photosensitive composition having the reciprocity law failure characteristic, the areas of the above dots on the photosensitive layer, i.e., the areas of phosphor dots, are substantially smaller than the areas which have been irradiated through the shadow mask. Therefore, in a color cathode-ray tube completed by using the shadow mask, the diameter of electron beam irradiated through the shadow mask is larger than that of the phosphor dot. For this reason, the resultant color cathode-ray tube is clear and excellent in contrast.

However, the above prior art has not taken account of achievement of larger size color cathode-ray tubes, and in manufacturing large-sized color cathode-ray tubes, its problem is that since the surface to be exposed is apart from a light source, the illumination intensity on an exposed surface decreases and the exposure therefore requires a long period of time.

SUMMARY OF THE INVENTION

It is an object of this invention to provide a high-sensitivity photosensitive composition, a process for forming a pattern using same and a high-molecular compound responding to radiation with high sensitivity.

The above object is accomplished by at least one of [I] a photosensitive composition comprising at least (1) a copolymer containing at least a water-soluble nonphotosensitive monomer unit and another monomer unit having an azido group and an electrolytic functional group and (2) a water-soluble high-molecular compound which reacts with said copolymer and exhibits the reciprocity law failure characteristic, [II] a process for forming a pattern comprising a step of forming, on a surface on which to form a desired pattern, a coating of a photosensitive composition comprised of at least of a copolymer containing a water-soluble nonphotosensitive monomer unit and another monomer unit containing an azido group and an electrolytic functional group and a water-soluble high-molecular compound which reacts with the above copolymer and exhibits the reciprocity law failure characteristic, a step of exposing the coating of the photosensitive composition according to a desired pattern under the condition that oxygen is present, and a step of developing the above coating to form the pattern having areas which are substantially smaller than those of the irradiated areas, and [III] a high-molecular compound containing at least a water-soluble photosensitive monomer unit and at least one monomer unit selected from vinylazidobenzylideneacetophenone sulfonic acid, vinylazidobenzylideneacetophenone carboxylic acid, vinylazidocinnamylideneacetophenone sulfonic acid, vinylazidocinnamylideneacetophenone carboxylic acid and salts of these.

In this invention, the above copolymer is a water-soluble polymer containing a first, water-soluble nonphotosensitive monomer unit and a second monomer unit containing an azido group and an electrolytic functional group. The "monomer unit" here represents a structure of polymerized monomer, and stands for a structure identical with the structure resulting from polymerization of a monomer having the above substituents. Therefore, such monomer units may be formed by polymerizing a monomer having the above substituents or by polymerizing a monomer and then attaching the above substituents by chemical reactions.

In the copolymer of this invention, the amount of the above first monomer unit, i.e., water-soluble nonphotosensitive monomer unit, is preferably in the range of from 10 to 40 mol% based on the copolymer. If said amount is less than 10 mol%, the solubility of the copolymer in water is low. The amount of the above second monomer unit is preferably less than 90 mol %, or not less than 10 mol %, more preferably from 80 to 15 mol %, based on the copolymer. If said amount is less than 10 mol %, the sensitivity is decreased. Each of the first and second monomer units may comprise one type or two types or more of monomers, respectively.

Examples of the first, water-soluble nonphotosensitive monomer unit in the copolymer of this invention include structural units resulting from polymerizations of maleic acid, acrylic acid, methacrylic acid, styrenesulfonic acid, 2-acrylamide-2-methyl-1-propane-sulfonic acid, etc.

Examples of the second monomer unit include structural units resulting from polymerizations of vinylazidobenzylideneacetophenone sulfonic acid (X=SO$_3$H in the following formula [I]), vinylazidobenzylideneacetophenone carboxylic acid (X=COOH in the formula [I]), vinylazidocinnamylideneacetophenone sulfonic acid (X=SO₃H in the formula [II]), vinylazido-cinnamylideneacetophenone carboxylic acid (X=COOH in the formula [II]), and their salts such as ammonium salts, alkali metal salts, alkaline earth metal salts, etc.

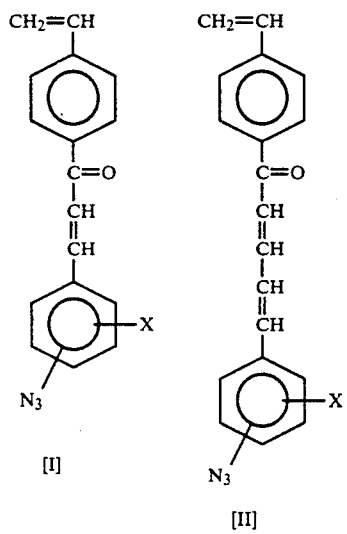

The copolymer of this invention may contain a third monomer unit in addition to the above first and second monomer units. Further, the third monomer unit may comprise one type or two types or more of monomers.

As was discussed hereinabove, the photosensitive composition of this invention comprises the above copolymer and the water-soluble high-molecular compound which reacts with the copolymer and exhibits the reciprocity law failure characteristic. The ratio of the copolymer to the water-soluble high-molecular compound is preferably in the range of from 1 to 50 wt. %, and more preferably in the range of from 5 to 30 wt. %. Examples of the water-soluble high-molecular compound include acrylamide-diacetone acrylamide copolymer, polyacrylamide, polyvinylpyrrolidone, vinylpyrrolidone copolymer, etc., and preferable are those which have excellent permeability to $O_2$ when they are formed into a coating.

The photosensitive composition of this invention may be used by adding thereto some other high-molecular material having a compatibility with the above water-soluble high-molecular compound, e.g, carboxymethyl-cellulose, etc. Such additives are referred to in the aforementioned U.S. Pat. No. 3917794 and others. It is also described in U.S. Pat. No. 3917794 that a surfactant such as polyoxyethylene alkyl ether or ethylene glycol, or the like is incorporated into the photosensitive composition in order to improve the coating properties, etc., and also that a coupling agent such as vinyltris(β-methoxyethoxy)silane, etc., is incorporated into the photosensitive composition in order to improve adhesion to a substrate. These techniques are also applicable to this invention.

In the process for forming a pattern in this invention, it is necessary to carry out the exposure under the condition that gaseous oxygen is present. Further, the exposure is carried out preferably when the Schwartzchild's constant, p, is in the range of $0 < p < 0.76$. The Schwartzchild's constant and riciprocity law failure are discussed in the aforementioned U.S. Pat. No. 3917794.

The copolymer of this invention well absorbs light having a wavelength, particularly, of 340 nm or 365 nm among the lights excited from an extra-high pressure mercury lamp. And said copolymer has a higher molecular weight than conventional bisazido compounds, and the number of azido groups which said copolymer had per molecule is also larger. For this reason, larger is the ratio of the increase in the molecular weight after the crosslinkage with regard to the number of crosslinked points formed by the same amount of exposure. Hence, the resultant photosensitive composition has higher sensitivity. As another reason for the higher sensitivity, the following has been found: since the azido copolymer of this invention is an electrolytic polymer and since the other base polymer to be mixed therewith is also electrolytic, etc., these two polymers, when mixed, attract each other electrically and form a tangle of polymers. As a result, when the azido group as photosensitive group is optically decomposed, the crosslinking efficiency of each of the polymers to the other is increased. That is because the distance between the azido group and the other polymer molecule, which is to undergo a crosslinkage reaction with the azido group, is shortened due to the above-mentioned tangle of polymers. The following is experimental data to demonstrate the foregoing results with regard to the typical azido copolymer of this invention. The structural formulae of the typical azido copolymer and base polymer are as follows.

Azido Copolymer

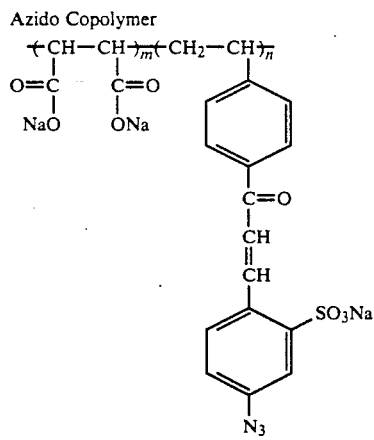

Acrylamide-diacetone acrylamide copolymer

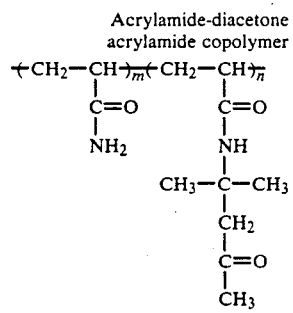

It has been found that the sensitivity changes depending upon the sizes of the counter ions of the above azido copolymer. In the experiment, tetraalkylammonium hydroxide salts, were used as a counter ion, and that of ammonia water was the smallest size, and that of tetrabutylammonium hydroxide salt was the largest size. The results are shown in Table 1. Tetraalkylammonium hydroxide salt has the following structural formula.

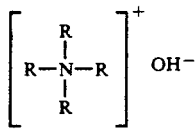

wherein R represents H, CH$_3$, C$_2$H$_5$, n-C$_3$H$_7$ or n-C$_4$H$_9$.

FIG. 1 shows that the use of the counter ion having the smallest size (use of ammonia water) exhibits the highest sensitivity. The above result is caused by the fact that the distance between the azido group and the other polymer in the tangle of polymers is affected by the counter ion size. For this reason, it is seen that even if the molecular weight of the azido polymer is small, and even if the proportion thereof in the mixture with the other polymer is small, the high sensitivity is well exhibited.

Further, since the azido copolymer has a water-soluble nonphotosensitive monomer unit, the copolymer is water-soluble.

DETAILED DESCRIPTION OF THE PREFERRED EMBODIMENTS

Figure 1:
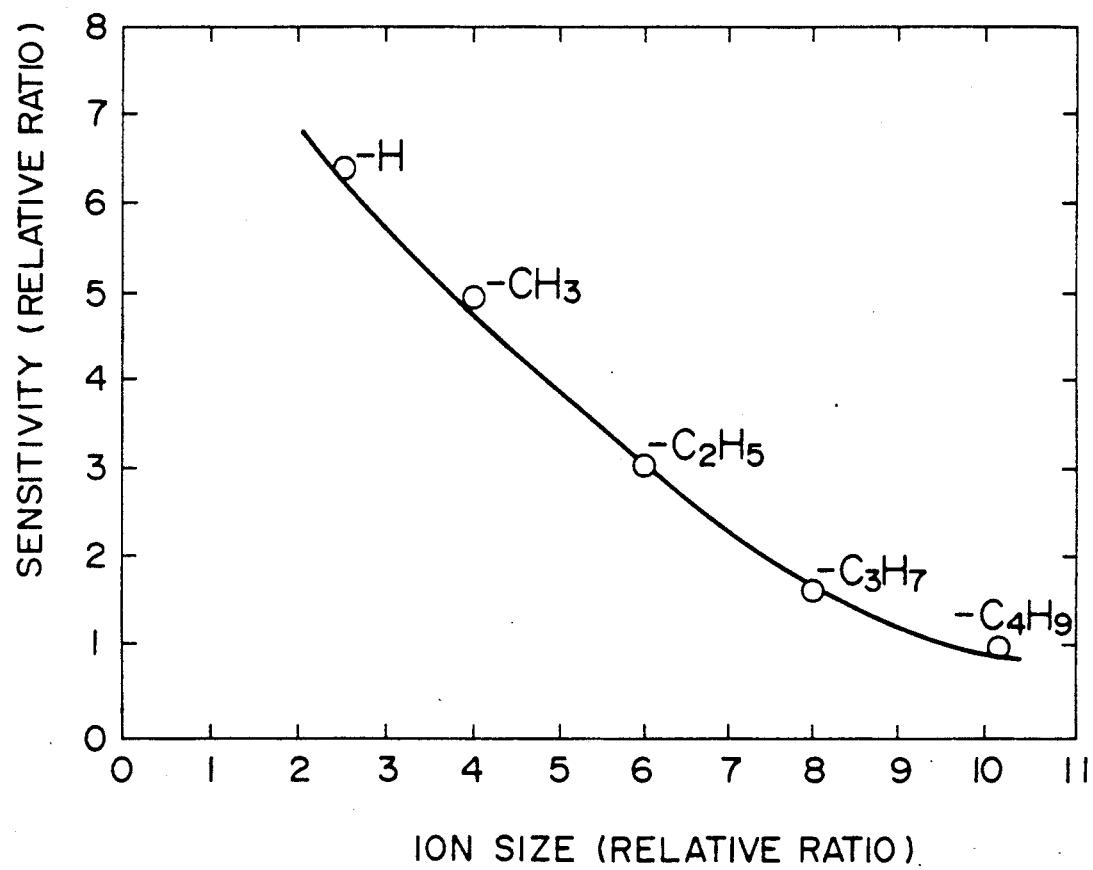
FIG. 1 is a chart showing a relationship between the counter ion size in a copolymer of the azido polymer and the sensitivity.

The following Examples will illustrate this invention in detail.

EXAMPLES 1-3

Synthesis of maleic acid-sodium 4-vinylmonoazidobenzylideneacetophenonesulfonate copolymer [III]:

Sixteen grams of poly(styrene-maleic anhydride) (75 mol % styrene, molecular weight: 1,900, made by Polyscience Inc.) was dissolved in a mixed solvent of 50 ml of chloroform and 50 ml of carbon disulfide. The resultant solution was added dropwise, with stirring at room temperature, to a solution of 25 g of acetyl chloride and 43 g of anhydrous aluminum chloride in a mixed solvent of 100 ml of chloroform and 100 ml of carbon disulfide. Then, the mixture was heated and refluxed for 2 hours with stirring. The mixture was cooled and then filtered, and an insolubilized substance was dried. The dried substance was powdered, and then the powder was treated with a large amount of water, well washed with water, and then dried to give a polymer, which is a maleic acid-4-vinylacetophenone copolymer [IV]. In the polymer, about 10 mol % of the styrene unit, i.e., 7.5 mol % based on the total copolymer, remained unreacted.

1 g of the above copolymer [IV], 2 g of sodium 4-azidobenzaldehyde-2-sulfonate and 0.3 g of sodium hydroxide were dissolved in a mixed solvent of 40 ml of ethyl alcohol and 40 ml of water. The mixture was left to stand at room temperature for a period of time shown in Table 1, and a precipitate was filtered and dried to give maleic acid-sodium 4-vinylmonoazidobenzylideneacetophenonesulfonate [III].

TABLE 1

| Example No. | Reaction time (h) | Azidized monomer unit (mole %) |
| --- | --- | --- |
| 1 | 4 | 12 |
| 2 | 8 | 15 |
| 3 | 24 | 17 |

The above azidized monomer units stand for a proportion based on the total copolymer. That is, the product obtained in Example 1 is a copolymer in which the maleic acid unit is 25 mol %, the styrene unit is 7.5 mol %, the vinylacetophenone unit is 55.5 mol % and the vinylmonoazidobenzylideneacetophenone sulfonic acid unit is 12 mol %.

EXAMPLE 4

Synthesis of maleic acid-sodium 4-vinylomonoazidocinnamylideneacetophenonesulfonate copolymer [V]:

One gram of the maleic acid-4-vinylacetophenone copolymer [IV] synthesized in Example 1, 2 g of sodium 4-azidocinnamaldehyde-2-sulfonate and 0.3 g of sodium hydroxide were dissolved in a mixed solvent of 40 ml of ethyl alcohol and 40 ml of water, and the mixture was left to stand at room temperature for 24 hours. The resultant precipitate was filtered and dried to give a maleic acid-sodium 4-vinylmonoazidocinnamylideneacetophenonesulfonate [V]. The copolymer was composed of 25 mol % of maleic acid unit, 7.5 mol % of styrene unit, 50.5 mol % of vinylacetophenone unit and 17 mol % of sodium vinylmonoazidocinnamylideneacetophenonesulfonate unit.

EXAMPLES 5-8

Each of the azido group-containing copolymers obtained in Examples 1 to 4 was used to prepare a solution of photosensitive composition having the following compositional proportions. The solution was spin-coated on a glass plate such that the thickness was 0.5 to 0.7 μm, and the coating was dried to give a film.

| Compositional proportions: (wt. %) | |
| --- | --- |
| Acrylamide-diacetone acrylamide copolymer (copolymerization ratio: acrylamide 2, diacetone acrylamide 1) | 2.0% |
| Azido group-containing copolymer | 0.44% |
| Sorbitol | 0.02% |
| Ethylene glycol | 2% |
| Silane coupling agent | 0.002% |
| Water | residual portion |

Table 2 shows data of sensitivity obtained by shows data of Comparative Example in which a bisazido compound (disodium 4,4'-diazidostilbene-2,2'-disulfonate) was used in place of the azido group-containing copolymer. With regard to evaluation of the sensitivity, a sample was irradiated with light from an extra high pressure mercury lamp for 20 seconds and developed at warm water having a temperature of about 40° C., and the sensitivity was determined according to how much illumination (W/m$^2$) was required to obtain a pattern of predetermined hole diameter (160 μm). The copolymer of Comparative Example required an illumination of 1.43 W/m$^2$, whereas the use of the copolymer of Example 3 required an illumination of 0.41 W/m$^2$ to give a pattern of the same hole diameter.

TABLE 2

| Example No. | Azido group-containing copolymer | Sensitivity |
| --- | --- | --- |
| 5 | [III] (Example 1) | 2.1 |
| 6 | [III] (Example 2) | 2.5 |
| 7 | [III] (Example 3) | 3.5 |
| 8 | [V] (Example 4) | 3.5 |
| Comparative Example | Bisazido compound | 1 |

EXAMPLE 9

A composition consisting of 1.5 wt % of acrylamidediacetoneacrylamide copolymer, 0.15 wt % of the azido group-containing copolymer obtained in Example 3, 0.0015 wt % of a silane coupling agent and the remaining portion of water was spin-coated on a panel, and the coating was dried. Then, a shadow mask was fixed thereon, and, on a rotary light source exposure bed, those positions of the coating which phosphors of red, blue and green were to be attached to were exposed to a light source of an extra-high pressure mercury lamp in the presence of 1 atmosphere air. The coating was spray-developed with a warm water for 2 minutes and dried. Then, black carbon was coated, the coated panel was again dried and immerced in an etching liquid having a temperature of 50° C. for 3 minutes, and the dot portions were removed together with carbon thereon to give a black matrix. The black matrix hole had a substantially smaller area than the exposed portion. Thereafter, the conventional procedures of phosphors coating, aluminizing, frit baking and electron gun sealing were carried out to give a black matrix color cathode-ray tube. In the above process, the exposure time was short as compared with the use of conventional compositions.

What is claimed is:

1. A process for forming a pattern which comprises the steps of:

forming, on a surface on which to form a desired pattern, a coating of a photosensitive composition comprising a copolymer containing at least a water-soluble nonphotosensitive monomer unit having an electrolytic functional group and another monomer unit having an azido group and an electrolytic functional group, and a water-soluble high molecular copolymer or polymer which reacts with said copolymer and exhibits reciprocity law failure characteristic and having an electrolytic functional group, exposing the coating of the photosensitive composition according to a desired pattern under the conditions that oxygen is present, and developing the coating to form the pattern of areas which are substantially smaller than irradiated areas.

* * * * *